US009473077B2

United States Patent
Feldman et al.

(10) Patent No.: US 9,473,077 B2
(45) Date of Patent: Oct. 18, 2016

(54) AMPLIFIER LINEARIZATION USING PREDISTORTION

(75) Inventors: Ariel Feldman, Raanana (IL); Udi Suissa, Raanana (IL)

(73) Assignee: DSP Group Ltd., Herzelia (IL)

( * ) Notice: Subject to any disclaimer, the term of this patent is extended or adjusted under 35 U.S.C. 154(b) by 201 days.

(21) Appl. No.: 14/240,774

(22) PCT Filed: Aug. 30, 2011

(86) PCT No.: PCT/IL2011/000697
§ 371 (c)(1),
(2), (4) Date: Oct. 1, 2014

(87) PCT Pub. No.: WO2013/030815
PCT Pub. Date: Mar. 7, 2013

(65) Prior Publication Data
US 2014/0292412 A1    Oct. 2, 2014

(51) Int. Cl.
*H03F 1/26* (2006.01)
*H03F 1/32* (2006.01)

(52) U.S. Cl.
CPC .......... *H03F 1/3247* (2013.01); *H03F 1/3241* (2013.01); *H03F 2201/3227* (2013.01)

(58) Field of Classification Search
CPC .......................... H03F 1/3241; H03F 1/3247
USPC ....................... 330/149; 455/114.3
See application file for complete search history.

(56) References Cited

U.S. PATENT DOCUMENTS

| | | |
|---|---|---|
| 6,493,400 B1 | 12/2002 | Greeley et al. |
| 2006/0008028 A1 | 1/2006 | Maltsev et al. |
| 2006/0240786 A1 | 10/2006 | Liu |
| 2009/0153132 A1 | 6/2009 | Tufillaro et al. |
| 2010/0056082 A1 | 3/2010 | Chiu et al. |
| 2010/0308910 A1* | 12/2010 | Barnes .................. H03F 1/3247 330/149 |
| 2011/0074506 A1* | 3/2011 | Kleider ................ H03F 1/3294 330/149 |

FOREIGN PATENT DOCUMENTS

| | | |
|---|---|---|
| CN | 101800546 | 8/2010 |
| WO | WO2006/104408 | 10/2006 |

OTHER PUBLICATIONS

Franz, M.O., "Volterra and Wiener Series", Scholarpedia.org, 2011.*
Giesbers, D. et al., "Adaptive Digital Predistortion Linearisation for RF Power Amplifiers", Electronics New Zealand Conference, pp. 244-248, 2006.
Nezami, M.K., "Fundamentals of Power Amplifier Linearization Using Digital Pre-Distortion", High Frequency Electronics, pp. 54-59, Sep. 2004.
Dawson, J.L., "Power Amplifier Linearization Techniques: An Overview", Workshop on RF Circuits for 2.5G and 3G Wireless Systems, Feb. 2001.
PCT/IL2011/000697, PCT International Search Report, Jun. 2012.
PCT/IL2011/000697, PCT Written Opinion of the ISA, Jun. 2012.

\* cited by examiner

*Primary Examiner* — Steven J Mottola
(74) *Attorney, Agent, or Firm* — Zaretsky Group PC; Howard Zaretsky

(57) ABSTRACT

A device and method of predistortion linearization that account for both EVM and spectral mask are disclosed. The device and method are based on transforming the predistorter optimization problem from the time domain to the frequency domain, and weighting the equations according to one or more desired objectives. One objective focuses on abiding by the spectral mask, whereas another objective focuses on improving the EVM.

20 Claims, 7 Drawing Sheets

AMPLIFIER LINEARIZATION USING PREDISTORTION

BACKGROUND

The present disclosure generally relates to power amplifiers, and more specifically to predistortion of power amplifiers.

In general terms, an amplifier is a device for increasing the power of a signal. In an ideal world, an amplifier would take an input signal and linearly increase the power of the output signal. In the real world, the inherent output of typical power amplifiers, such as those used for wireless transmissions, is not linear with the input signal. While the output of the amplifier may linearly increase within limits, a point is reached when the amplifier becomes saturated and cannot produce any more output. This state is called clipping, resulting in distortion.

In the context of communication systems, unwanted nonlinearity may cause the transmitted signal spectrum spread into adjacent frequency channels, adversely interfering with adjacent ones. To mitigate this undesired result, a transmitter is often assigned a spectral mask, also known as a channel mask or transmission mask, which bounds the allowed transmission power at each frequency.

A concept related to communication efficiency is error vector magnitude ("EVM"), also referred to as receive constellation error or RCE. EVM is a measure used to quantify the performance of a transmitter or receiver. In an ideal world, a signal sent from a transmitter or received by a receiver would have all constellation points precisely at their ideal locations. In practice, system imperfections, such as phase noise or carrier leakage, cause the actual constellation points to deviate from the their ideal locations. The average deviation from the designated locations of the constellation points over all subcarriers and over large enough number of OFDM symbols is referred to as EVM. If high fidelity communication is desired, then having a low EVM is key. In general, as the data rate of transmission increases, additional bits per constellation point increases (i.e. the constellation increases), thus requiring better EVM. As the data rate of transmission decreases, the limits on desired EVM may increase but meeting the required spectral mask becomes more difficult.

Known techniques to reduce nonlinear effects of power amplifiers include feedback, feedforward, and predistortion. Such techniques are set forth in Joel L. Dawson, *Power Amplifier Linearization Techniques: An Overview, Workshop on RF Circuits for 2.5G and 3G Wireless Systems*, Feb. 4, 2001. The techniques aim at reducing the EVM, while complying with spectral emission mask constraints. In this manner, communication is enabled at high data rates and/or higher output powers, relative to uncompensated or less compensated amplifiers.

Predistortion involves modifying the signal before amplification in an effort to cancel out any distortion of the signal after amplification. Typical predistortion involves determining the characteristics of the nonlinearity of the output signal and inverting such characteristics in the input signal such that the combined transfer characteristic is linearized. Such linearization is usually performed digitally or discretely with subsequent conversion to an analog signal.

Basic concepts and mathematical foundations for digital predistortion are reported in Mohamed K. Nezami, *Fundamentals of Power Amplifier Linearization Using Digital Pre-Distortion*, 2004 High Frequency Electronics, Summit Technical Media, LLC. A polynomial based predistortion for linearization of an RF power amplifier is presented in D. Giesbers, S. Mann, K. Eccleston, *Adaptive Digital Predistortion Linearization for RF Power Amplifiers*, Electronics New Zealand Conference 2006. Predistortion and postdistortion correction of both a receiver and transmitter during calibration is set forth in U.S. Patent Application No. 2009/0316826.

Generally, predistortion is carried out as a compromise or trade-off between data rate of linearized output and a constraint of the spectral emission mask. In other words, known predistortion techniques fail to account properly for both EVM and spectral mask. To elaborate, in multi-rate systems such as IEEE 802.11, at high rates the spectral mask may be achieved but with poor EVM, while at low rates the spectral mask is violated while there is plenty of margin on EVM. At intermediate rates, the spectral mask may be slightly violated and EVM may be improved but with higher power. Not only are both EVM and spectral mask parameters not accounted for in today's predistortion techniques, but known predistortion techniques also focus on the predistortion optimization problem in the time domain perspective. Doing so has continually lead to unsatisfactory results.

A device and method of predistortion linearization that account properly for both EVM and spectral mask, and do so by focusing on the frequency domain rather than the time domain, are therefore desired.

SUMMARY

One exemplary embodiment of the disclosed subject matter is a device for linearizing an output of a power amplifier. The device comprises an input interface for a source signal, circuitry adapted to distort the source signal by applying one or more frequency domain equations involving one or more parameters affecting the output of a power amplifier, and an output interface for the output signal. The circuitry provides an output signal inversely distorted according to the nonlinearity of the output of the power amplifier. The parameters preferably include the spectral mask and the EVM. One frequency domain equation is preferably directed to abiding by the spectral mask, whereas another equation is preferably directed to improving the EVM. The circuitry is most preferably configured to weight one equation more strongly than the other equations depending on the objective.

Another exemplary embodiment of the disclosed subject matter is a method for linearizing an output of a power amplifier. The method comprises identifying one or more parameters, such as the spectral mask and the EVM, that affect the output of a power amplifier. The method may further include applying one or more frequency domain equations involving the one or more parameters to provide an output signal inversely distorted according to the nonlinearity of the output of the power amplifier. One equation may linearize the output of the power amplifier in a range constrained by a spectral mask, whereas another equation may linearize the output of the power amplifier to assure compliance with the spectral mask. One equation may be weighted more strongly than the other.

A further exemplary embodiment of the disclosed subject matter is a method of calibrating a predistorter for linearizing output signals from a power amplifier. The method may comprise determining in the output of a power amplifier a range constrained by a spectral mask and a range where the spectral mask is not violated but EVM performance can be improved. The method may also include applying a frequency domain equation to linearize the output of the power amplifier in the range constrained by the spectral mask to reduce EVM. The method may also include applying a frequency domain equation to linearize the output of the power amplifier in the range where the spectral mask is not violated but EVM performance can be improved.

BRIEF DESCRIPTION OF THE DRAWINGS

Some non-limiting exemplary embodiments of the disclosed subject matter are illustrated in the following drawings. Identical or duplicate or equivalent or similar structures, elements, or parts that appear in one or more drawings are generally labeled with the same reference numeral, optionally with an additional letter or letters to distinguish between similar objects or variants of objects, and may not be repeatedly labeled and/or described. Dimensions of components and features shown in the figures are chosen for convenience or clarity of presentation. For convenience or clarity, some elements or structures are not shown or shown only partially and/or with different perspective or from different point of views.

DETAILED DESCRIPTION

A general problem in the field of power amplifiers is the inherent nonlinearity of the output of a power amplifier. A general solution is to modify the signal fed to the power amplifier, or alternatively, the output signal, with an inverse distortion in order to linearize the output of a power amplifier.

A technical problem in the field of power amplifiers is controlling a signal transmission to achieve high data rate and/or higher output power while abiding by the spectral mask assigned for transmission and doing so within the desired EVM. A technical solution implementing the spirit of the disclosed inventions accounts for the EVM. Another technical solution implementing the spirit of the disclosed inventions accounts for the spectral mask. Yet another technical solution implementing the spirit of the disclosed inventions accounts for both EVM and spectral mask. The technical solution is based on transforming the predistorter optimization problem from the time domain to the frequency domain, and weighting the equations according to one or more desired objectives. One objective focuses on abiding by the spectral mask, whereas another objective focuses on improving the EVM.

Potential benefits of the general and technical solutions provided by the disclosed subject matter include lower EVM; higher data rate; smaller output power back-off with reduced interference in adjacent bands; and higher transmission power with greater range relative to overall linearization.

A general nonlimiting overview of practicing the present disclosure is presented below. The overview outlines exemplary practice of embodiments of the present disclosure, providing a constructive basis for variant and/or alternative and/or divergent embodiments, some of which are subsequently described.

Figure 1A:
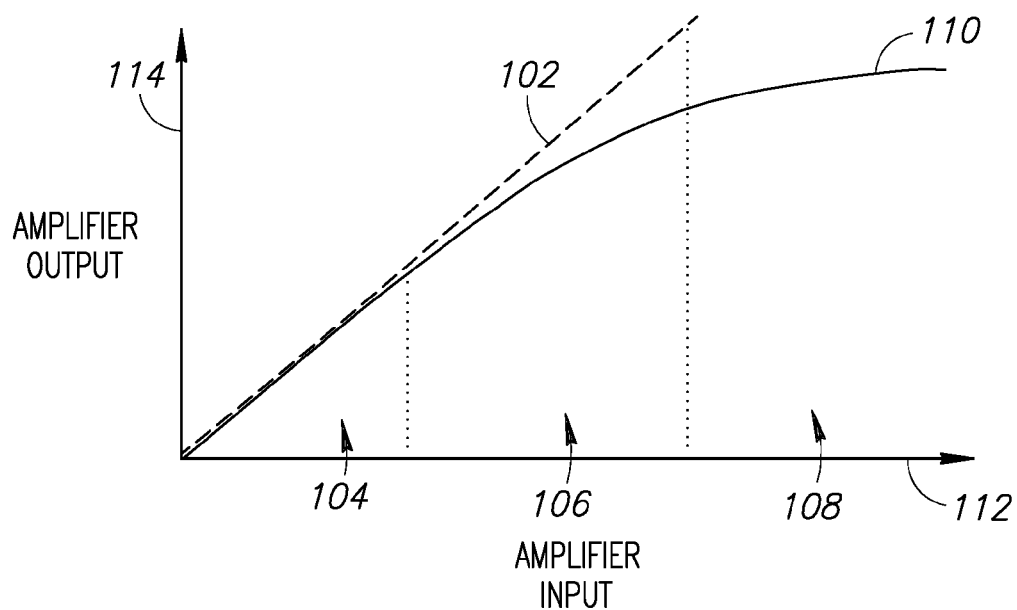
FIG. 1A illustrates an amplitude response to an input signal in a power amplifier.

FIG. 1A illustrates the inherent nonlinearity of the output of a power amplifier. A horizontal axis 112 denotes the input signal, such as expressed in dBm, and a vertical axis 114 denotes the output amplitude of the power amplifier, such as expressed in dBm. In an ideal world, an amplifier would take an input signal and linearly increase the power of the output signal, as illustrated by the dotted line 102. Solid line 110 illustrates the real world in which an output signal by the amplifier becomes nonlinear.

Three zones may be seen in amplitude response 110. Zone 104 illustrates that at low input signals, the output is generally linear. As the input signal increases, the output becomes less linear, as seen in zone 106. A final zone, denoted as zone 108, curves to a slow ascent and progressively approaches saturation with respect to the input signal, i.e., increasing the input signal will progressively yield a smaller and smaller increase in the output until, at some point, no further increase is attained.

Typically, the nonlinearity of zone 106 and zone 108 cause deformations in the output of the amplifier such as phase shifts relative to the input signal, higher EVM, and expansion of frequency spread or other impairments. Additionally, memory or hysteresis effects, due for example to elements such as capacitors, may further induce deformations in the output signal.

Figure 1B:
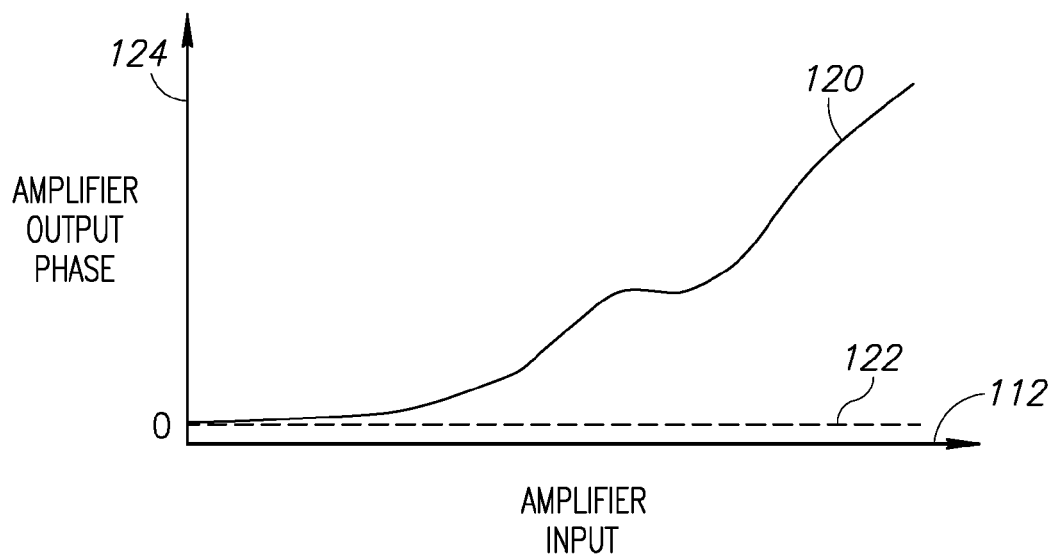
FIG. 1B illustrates a phase shift response to an input signal in a power amplifier.

FIG. 1B illustrates a phase shift response 120 to an input signal in a power amplifier where the phase shift is a manifestation of a deformation in the output signal of the amplifier. A horizontal axis 112 denotes the input signal, such as expressed in dBm, and a vertical axis 124 denotes the phase shift, such as expressed in degrees. The phase shift increases as the input signal increases in a manner similar to the increasing nonlinearity of amplitude response 110 shown in FIG. 1A. In the ideal world, a linearization of phase shift response 120 is depicted as a dashed horizontal line about a zero phase shift.

Figure 2A:
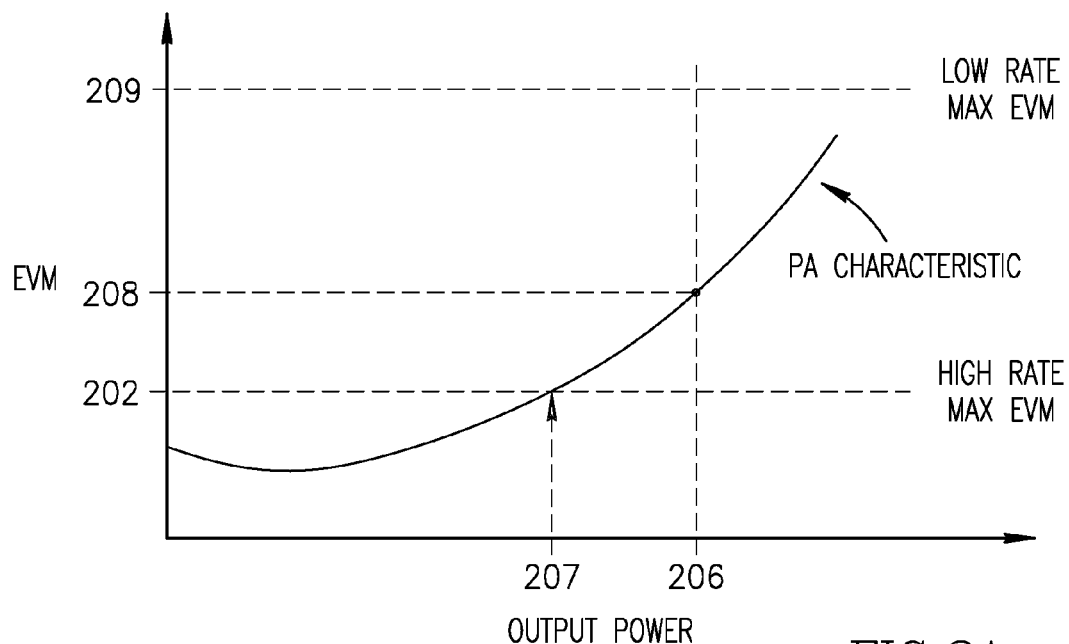
FIG. 2A illustrates a curve depicting a relationship between an output power of a power amplifier and EVM.

FIG. 2A illustrates the seemingly non-congruent or conflicting objectives of improving the EVM versus abiding by or conforming to the spectral mask constraint. The output power is represented by a horizontal axis in units such as mW, and the EVM is represented by a vertical axis by units such as percentage. The dashed line at 202 on the EVM vertical axis represents a constraint for the maximum EVM allowed for high data rate, i.e., above which the data rate should be changed to a lower rate to reduce the EVM. The dashed line at 209 on the EVM vertical axis represents a constraint for the maximum EVM allowed for low rate, i.e., above which the transmitter signal fidelity is undesirable or generally unacceptable. The dashed line at 208 on the EVM vertical axis represents the maximum EVM for an intermediate high data high rate, for example, 16-QAM. The dashed line at 206 on the output power horizontal axis represents the limit or constraint of the spectral mask (also known as spectrum emission mask), i.e., the maximum output power allowed yet without violating the spectral mask. Although the spectral mask is generally expressed in units of frequency, for convenience the spectral mask limitation is represented here by power units since, as noted above, the nonlinearity of the power amplifier affects the frequency spreading of the output towards the spectral mask. The solid curved line represents the power amplifier characteristic.

As seen in FIG. 2A, at high data rates, spectral mask is not the issue; EVM is. Conversely, at low data rates, EVM is not the issue; spectral mask is. To elaborate, transmission at power higher than 207 at high rate violates the maximum EVM requirement, but there is plenty of margin as far as spectral mask violation is concerned as 207 is less than 206. Conversely, transmission at low rate with power exceeding 206 violates the spectral mask constraint, but there is plenty of margin as far as EVM is concerned as 208 is less than 209.

From another perspective, FIG. 2A demonstrates that at high rates the spectral mask constraint may be maintained at the expense of EVM, while in low data rates the spectral mask is violated while there is a potential for improving the EVM. Furthermore, at intermediate data rates, the spectral mask may be slightly violated and EVM may be improved with higher power.

Thus, in some embodiments, the output curve of the power amplifier may be linearized in sections; one section linearized with EVM objective for power up to line 206 that represents the limit of the spectral mask, and one section linearized with spectral mask objective for power beyond line 206 that represents the limit of the spectral mask.

Figure 2B:
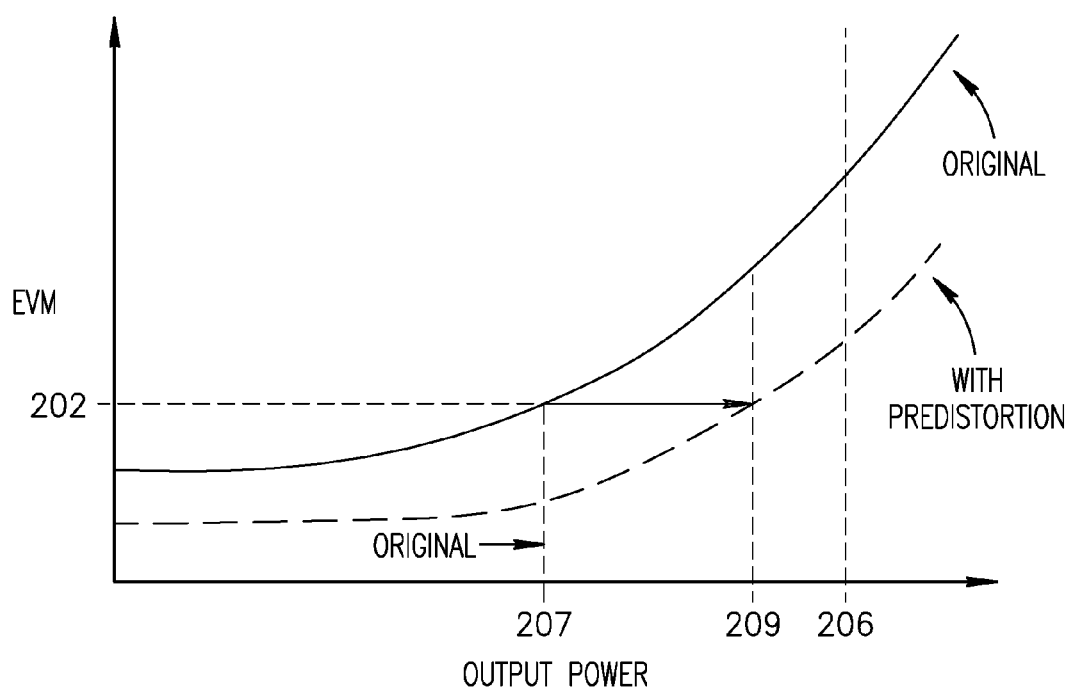
FIG. 2B illustrates a curve depicting a relationship between an output power of a power amplifier and EVM, after predistortion at high data rate to improve the EVM, according to exemplary embodiments of the disclosed subject matter.

FIG. 2B illustrates a curve depicting a relationship between the output power of a power amplifier and EVM, after predistortion at high data rate for low EVM, according to exemplary embodiments of the disclosed subject matter. With predistortion, the power amplifier characteristic moves the maximum power transmitted at high rate to 209, which is acceptable since 209 is less than or equal to 206 in the context of FIG. 2B.

Figure 2C:
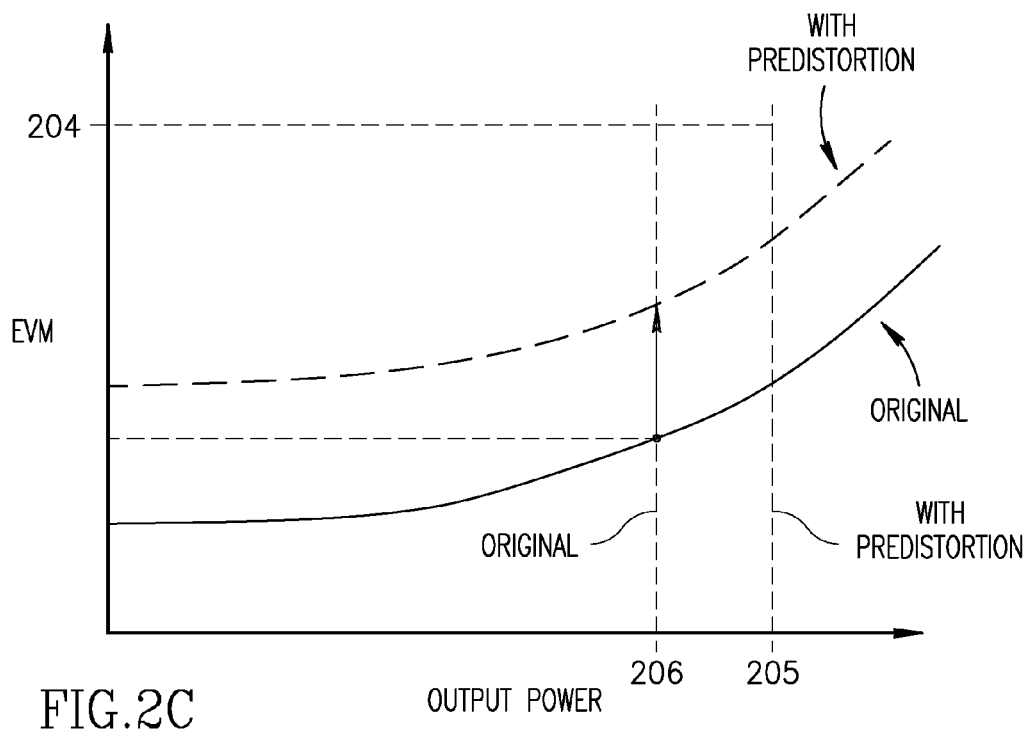
FIG. 2C illustrates a curve depicting a relationship between an output power of a power amplifier and EVM, after predistortion at low data rate to abide by the spectral mask, according to exemplary embodiments of the disclosed subject matter.

FIG. 2C illustrates a curve depicting a relationship between an output power of a power amplifier and EVM, after predistortion at low data rate for conformance to the spectral mask, according to exemplary embodiments of the disclosed subject matter. At low rate, the predistorted power amplifier characteristic deteriorates EVM but the spectral mask is only violated above 205.

Figure 3A:
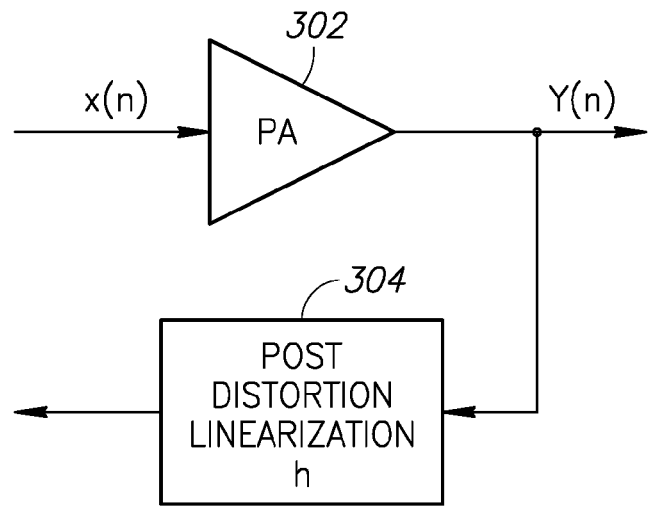
FIG. 3A illustrates a scheme of a power amplifier block and a linearization block that operates responsively to the output of the power amplifier block.
Figure 3B:
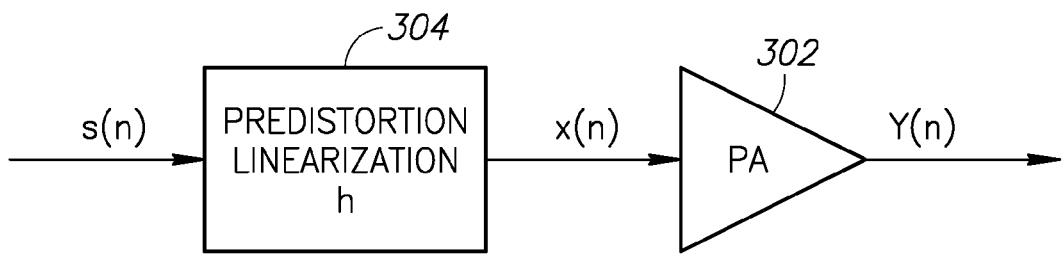
FIG. 3B illustrates a scheme of a power amplifier block and a predistortion block.

FIG. 3A illustrates a scheme or model of a power amplifier block 302 and a post-distortion linearization block 304 that operates responsively to the output of power amplifier block 302, according to exemplary embodiments of the disclosed subject matter. The parameters output from the post-distortion block 304 may be used in a predistortion block such as that shown in FIG. 3B. In particular, FIG. 3B illustrates another scheme or model of power amplifier block 302 and predistortion block 304, according to exemplary embodiments of the disclosed subject matter. Unlike a dynamic feedback scheme or closed-loop model, the scheme of FIG. 3B is an open-loop model where a static preset predistortion is used. Namely, predistortion block 304 modifies a source signal s(n) to form the input signal x(n) for power amplifier block 302 to linearize the output signal y(n) of power amplifier block 302, at least to a certain extent.

The preset predistortion is obtained or determined such as by a calibration procedure. As actual components or modules or systems may not have identical characteristics, in some cases each component or module or system is calibrated individually such as in the assembly line. The static predistortion may comprise a plurality of predistortion variants or procedural rules, such as interpolation rules, adapted for various conditions. For example, the calibration is conducted at several temperatures in an expected operational range, and subsequently using a temperature sensor to determine the temperature in operation while interpolating for non-calibrated temperature if determined necessary. Likewise, for example, the calibration is conducted at several frequency bands in an expected operational range.

In some embodiments, a combination of the models of FIG. 3A and FIG. 3B may be used or modified. For example, a partial static preset predistortion and a partial dynamic feedback predistortion may be employed. Optionally or additionally, other schemes may be used such a feedback from additional stages after one or more predistortion operations to refine the linearization of the final output of power amplifier block 302. The output signal y(n) of power amplifier block 302 may illustrate nonlinearity or distortions due to other components in a system in addition to power amplifier block 302, for example, reactive elements or characteristics such as residual capacitance or induction. In some other embodiments, the amplifier block depicted in FIGS. 3A, 3B can further comprise a closed loop to provide predistortion optimization during operation of the apparatus and method described herein.

Typically, without limiting, the predistortion is performed digitally on digital signals where, eventually, the resultant digital signal is converted to an analog signal as an input to the power amplifier. Similarly, the feedback may be carried out in analog form, or the output signal converted to a digital signal to perform the linearization.

FIG. 3A and FIG. 3B illustrate schematic principles; there may be more blocks between the predistortion and power amplifier block 302, such as up converters or filters.

Referring to FIG. 3A, the objective of h is to filter y(n) in such a way that y(n) would be transferred back to x(n), where subsequently h is used as an input to power amplifier block 302 as described in FIG. 3B. Thus, s(n) is expressed as:

$$s[n] = \sum_{p=1}^{P} \sum_{m=0}^{M_p} h_{p,m} |x[n-m]|^{k-1} x[n-m] \qquad (1)$$

where P is the maximum power order used, p is the power index, $M_p$ is the filter length used for the $p^{th}$ power, and m is the time delay index. As one parameter of this equation uses the time delay index, the focus on the predistortion optimization problem at this stage is from the perspective of the time domain. This technique is known in the art as pre-post $p^{th}$-order inverse theory, as represented for example in M. Schetzen, *The Volterra and Wiener Theories of Nonlinear Systems*, reprinted Malabar, F L; Krieger, 2006.

For simplicity and without limiting, the static non-feedback scheme or model of FIG. 3B will be considered in the description below. In some embodiments, source signal s(n), input signal x(n), and output signal y(n) are vectors where "n" represents time index or memory stages embodied (without elaboration) in the scheme of FIG. 3A.

The scheme of FIG. 3A may be described mathematically as:

$$\underline{x} = Y \cdot \underline{h} + \underline{v} \quad (2)$$

Where:

$$\underline{x} = \begin{bmatrix} x[n] \\ x[n-1] \\ \ldots \\ x[n-N] \end{bmatrix}, \underline{h} = \begin{bmatrix} h_1 \\ h_2 \\ \ldots \\ h_P \end{bmatrix}, \quad (3)$$

$$Y = \begin{bmatrix} y[n] & y[n-1] & \ldots & y[n-L] & \ldots & |y[n]|^k & |y[n-1]|^k & \ldots & |y[n-L]|^k \\ y[n-1] & y[n-2] & \ldots & y[n-1-L] & \ldots & |y[n-1]|^k & |y[n-2]|^k & \ldots & |y[n-1-L]|^k \\ & & & & \ldots & & & & \\ y[n-N] & y[n-N-1] & \ldots & y[n-N-L] & \ldots & |y[n-N]|^k & |y[n-N-1]|^k & \ldots & |y[n-N-L]|^k \end{bmatrix} \quad (4)$$

and v represents an "error" of the linearization.

x(n) denotes the input to power amplifier block 302, $\underline{x}$ is a vector representing a vector of delayed x(n) in memory, "$\underline{h}$" is the linearization or predistortion operation of predistortion block 304 sought for, y(n) is the output of power amplifier block 302 while Y is a matrix of the delayed and powered version of y(n), "N" is the number of samples in memory, "L" is the time length of the filter, "P" is the number of predistortion coefficients, and "k" is the highest order used. The gain is reflected in "h". In some embodiments, a measurement noise as a signal "$\underline{v}$" is also incorporated in the static model of FIG. 3B. According to as described above, in some embodiments, the coefficients "$\underline{h}$" are determined by a calibration procedure.

Preferably, the predistortion is based on transforming equations that modify the linearization objective from a time domain to a frequency domain, and weighting the equations according to the desired objective. To elaborate, if the objective is abiding by the spectral mask, then higher weight is given to out-of-band spectral lines in the transform domain. If the objective is improving the EVM, then higher weight is given to the in-band spectral lines. Optionally, a combination of both weights is used to achieve the objectives of both a lower EVM and a conformance to the spectral mask, as described below.

Expressed as vectors and matrices accordingly, the solution equation for "$\underline{h}$" is depicted below where the solution may be expressed as ĥ.

$$\hat{\underline{h}} = (Y^H W Y)^{-1} Y^H W \underline{x}, \quad (5)$$

where $Y^H$ is the Hermitian form of matrix Y and W is a non negative symmetric, possibly diagonal matrix.

In a preferred embodiment the representation in equations (2) to (4) are transformed to the frequency domain by Fourier transform to give $$\underline{x}(f) = Y(f) \cdot \underline{h} + \underline{v}(f) \quad (6)$$

where Y(f), $\underline{x}(f)$ and $\underline{v}(f)$ are the transformed Y, $\underline{x}$ and $\underline{v}$ respectively.

The corresponding "solution" for $\underline{h}$ is given in equation (7)

$$\hat{\underline{h}} = (Y^H(f) \cdot W \cdot Y(f))^{-1} Y^H(f) \cdot W \underline{x}(f) \quad (7)$$

Preferably, without limiting, matrix "W" is a diagonal matrix as:

$$W = \begin{bmatrix} w_1 & 0 & \ldots & 0 \\ 0 & w_2 & \ldots & 0 \\ \ldots & \ldots & \ldots & \ldots \\ 0 & 0 & \ldots & w_N \end{bmatrix} \quad (8)$$

According to the equations and definitions above, "h" may be found by mathematical techniques well known in the art.

In some embodiments, other filters may be used including finite variants of a Volterra filter and/or different order. Optionally or alternatively, the linearization operation may be determined by successively modifying the operation according to successive results, optionally based on a known estimate. Optionally or additionally, the successive determination may be augmented by semi-analytic procedures like a Kalman filter or other methods including Bayesian methods. Optionally, other methods may be used including fuzzy logic or neural networks.

In some embodiments, calibration may be conducted or augmented by transmitting a signal and receiving the transmitted signal by a receiver with known response or a practically linear response, up to certain extents, optionally in an environment that simulates actual conditions such as by noise. The characteristics of the reception at the receiver, determined such as by a constellation diagram relative to an ideal constellation diagram or by EVM, are used in determining the predistortion operation.

Figure 4:
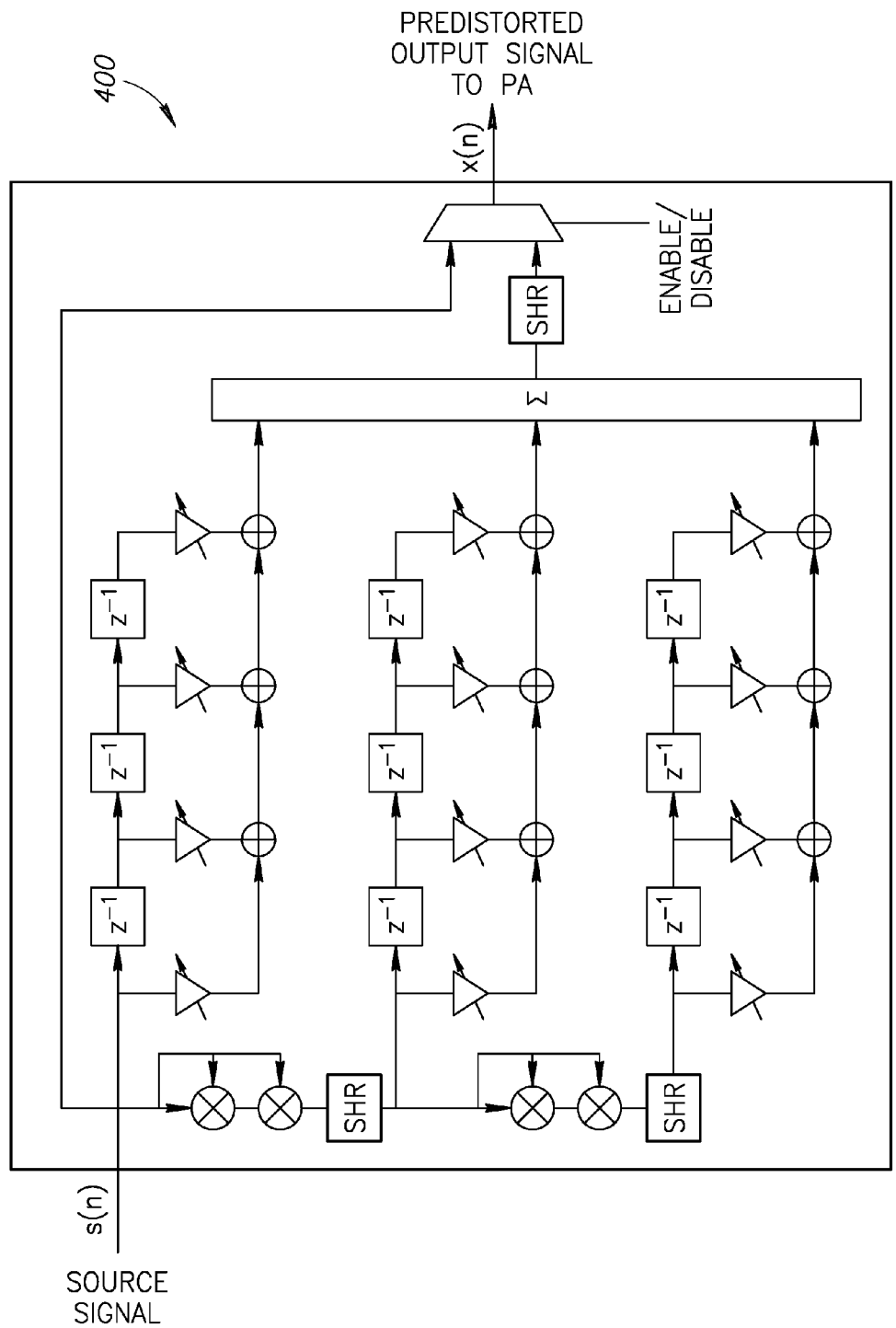
FIG. 4 illustrates a block diagram for implementing a predistortion block, according to exemplary embodiments of the disclosed subject matter.

FIG. 4 illustrates a block diagram 400 for digitally implementing a predistortion block, such as or akin to predistortion block 304 of FIG. 3B, according to exemplary embodiments of the disclosed subject matter. Block diagram 400 is shown as used in the art and the elements of block diagram 400 and interconnection therebetween may vary between implementations, such as, for example, the number of delay stages, denoted as $z^{-1}$. Source signal s(n) is an input signal to block diagram 400, and input signal x(n) to the power amplifier is a predistorted signal x(n) as an output signal from predistortion block 400.

In some embodiments, source signal s(n) is provided to block diagram 400 via an input interface or port, and in some embodiments, input signal x(n) to the power amplifier is provided as an output from predistortion block 400 via an output interface or port thereof. The input or output ports or interfaces are implied in block diagram 400 and not explicitly indicated. In some embodiments, the input and/or output ports or interfaces are mere connections, whereas in some embodiments, the input and/or output ports or interfaces comprise electronic circuitry for buffering the signal or for impedance matching.

Source signal s(n) may be a digital signal, or optionally and alternatively, source signal s(n) may be a digitized analog signal. Typically, without limiting, input signal x(n) is an analog signal that is input to an amplifier, such as denoted by power amplifier block 302 of FIG. 3A or FIG. 3B. Optionally, input signal x(n) is converted to analog form from a digital form. Input signal x(n) (output from the predistorter) is predistorted with an inverse distortion of the amplifier, at least partially and/or in an input range thereof, to linearize the output of the amplifier, at least partially and/or in an output range thereof.

In some embodiments, a device for linearization or predistortion of the output of a power amplifier comprises circuitry, such as or comprising an implementation of block diagram 400. The device is configured for predistorting a source signal to compensate for the nonlinear response of the power amplifier. The predistorter is operative to modify the input to the amplifier in accordance with the inverse of the nonlinear power amplifier response. The output of the amplifier may be modified to reduce the EVM regardless of the spectral mask in a range constrained by the spectral mask, and to conform to the spectral mask constraint regardless of the EVM in a range violating the spectral mask constraint.

In some embodiments, the device used for predistortion or linearization comprises a computerized device comprising, for example, a digital signal processor, with instructions executable by the processor and stored in a medium or device readable by the processor, such as a program stored in a memory device, or the instructions implemented in a circuitry such as gate array, or implemented as a combination thereof. In some embodiments, the instructions and/or circuitry are implemented to carry out the solution such as of formula (2) or formula (7) above.

Figure 5:
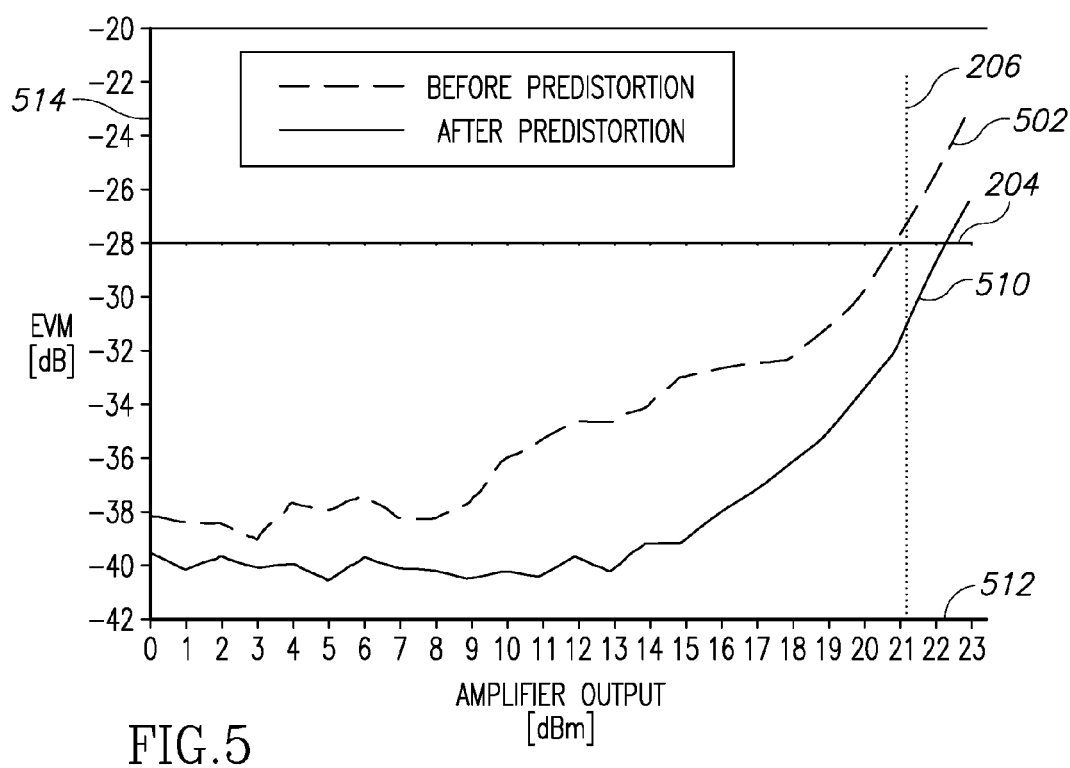
FIG. 5 illustrates an effect of a predistortion with respect to EVM, according to exemplary embodiments of the disclosed subject matter.

FIG. 5 illustrates an effect of predistortion on EVM on vertical axis 514 with respect to a power amplifier output on horizontal axis 512, according to exemplary embodiments of the disclosed subject matter, akin to FIGS. 2A, 2B and 2C. Solid curve 510 is after predistortion while dashed curve 502 is a corresponding curve before predistortion. Line 206 represents the limit of the spectral mask. Unlike curve 502, it is apparent that curve 510 is below the maximum EVM up to and beyond the limit of the spectral mask where the EVM with respect to curve 510 is lower than that of curve 502. This illustration demonstrates the improvement provided by predistortion such as by allowing transmission at higher data rates and/or higher output power than without predistortion.

Figures 6A, 6B:
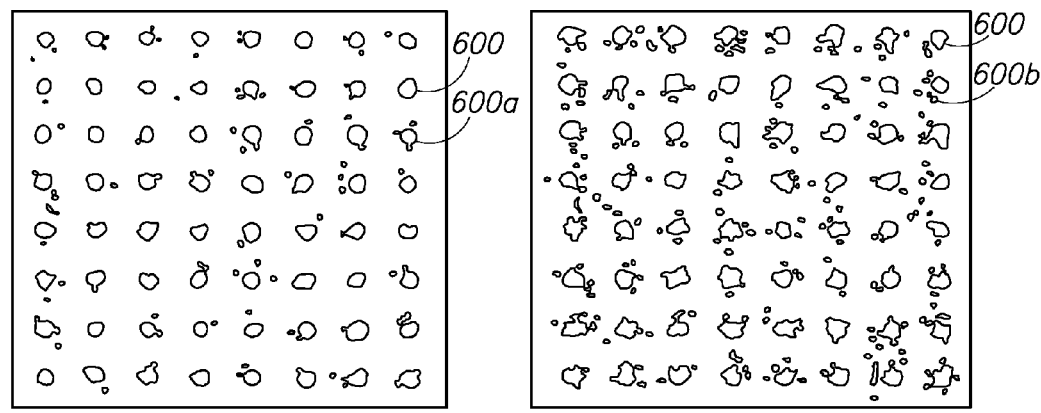
FIG. 6A illustrates an effect of a predistortion at a transmitter with respect to a constellation diagram at a receiver, according to exemplary embodiments of the disclosed subject matter.
FIG. 6B illustrates with respect to FIG. 6A a corresponding constellation diagram at a receiver without predistortion at the transmitter.

FIG. 6A illustrates an effect of predistortion at a transmitter with respect to the constellation diagram at a receiver, according to exemplary embodiments of the disclosed subject matter. FIG. 6B illustrates a corresponding constellation diagram at a receiver without the use of predistortion at the transmitter. The regions, such as region 600, represent the expected or designed location of the modulations of the transmission, whereas dots or regions such as region 602a in FIG. 6A and region 602b of FIG. 6B are, or represent, the detected modulations of the received transmission. It is apparent that the modulations as represented by regions such as region 602a in FIG. 6A are denser and located about the expected regions such as region 600 relative to the modulation such as 602b of FIG. 6B that are sparser and fall farther than the expected region such as region 600. Thus, as the distance of a detected modulation from the expected regions such as region 600 represents or reflects the EVM, the EVM in FIG. 6A after predistortion is lower than the EVM in FIG. 6B without predistortion.

Figure 7:
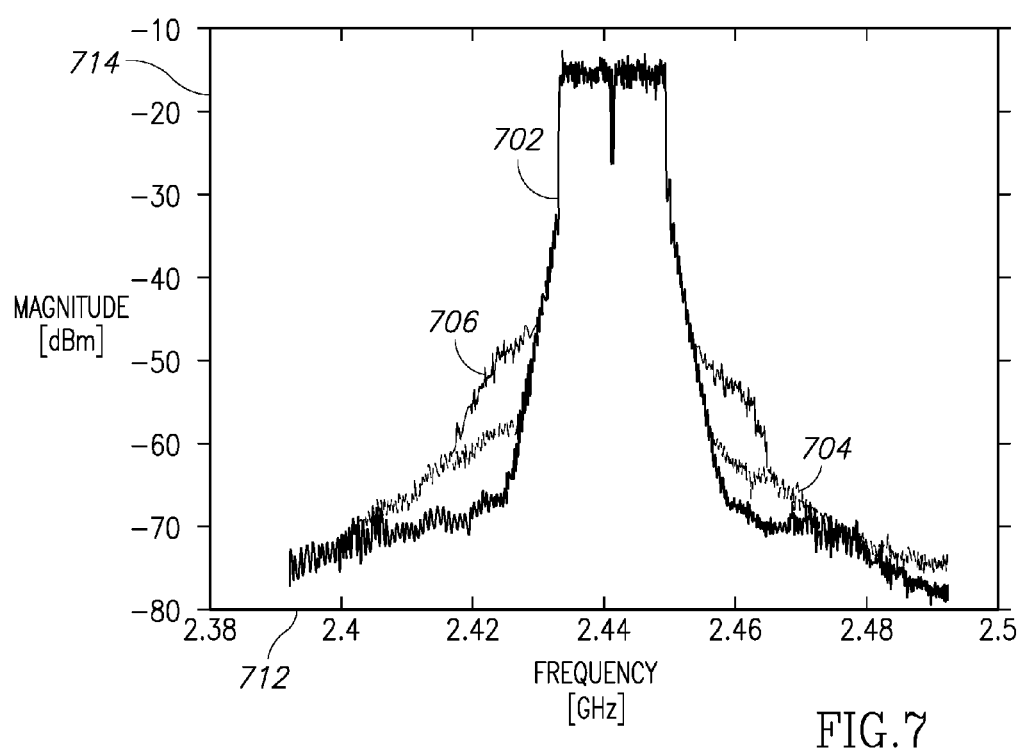
FIG. 7 illustrates an effect of a predistortion on the spectrum spread of a transmitter, according to exemplary embodiments of the disclosed subject matter.

FIG. 7 illustrates an effect of predistortion on the spectrum spread of a transmitter, according to exemplary embodiments of the disclosed subject matter. In particular, FIG. 7 illustrates a spectrum spread 702 of an input signal, a spectrum spread 706 of an output of a power amplifier without linearization or predistortion, and a spectrum spread 704 of an output of a power amplifier after linearization or predistortion. The spectrum spreads are illustrated in frequency in units of GHz at a horizontal axis 712, and the magnitude is represented at a vertical axis 714 in units such as dBm.

Relating to spectrum spread 702 of an input signal as a reference, such as having an original spectrum spread with is subsequently amplified by the power amplifier, it is apparent that spectrum spread 704 of an output of a power amplifier after linearization exhibits larger magnitude than spectrum spread 706 of an output of a power amplifier without linearization. The larger magnitude of spectrum spread 706 relative to spectrum spread 704 means, in some embodiments or cases, that there is less interference with other transmissions and/or better conformance to a spectral mask.

Figure 8A:
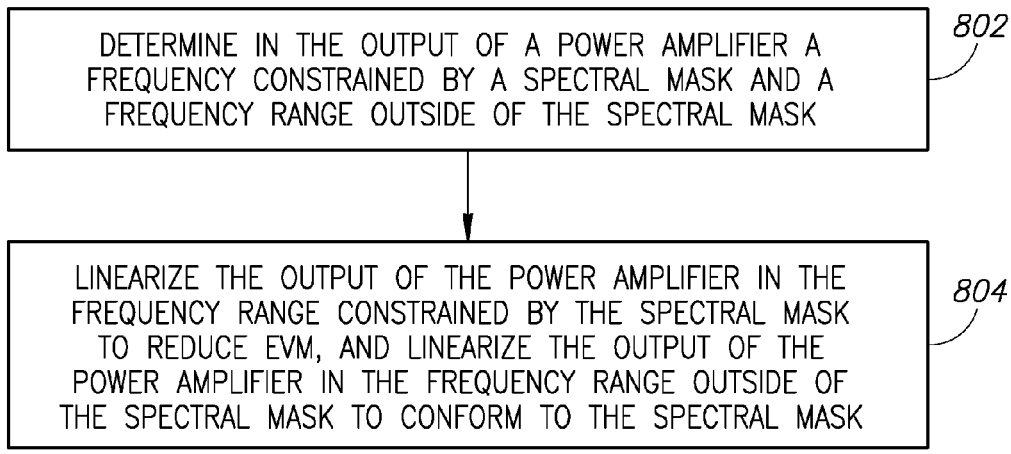
FIG. 8A illustrates an outline for linearization of the output of a power amplifier, according to exemplary embodiments of the disclosed subject matter.

FIG. 8A illustrates an outline for linearization, or an outline of a method for predistortion, of the output of a power amplifier, according to exemplary embodiments of the disclosed subject matter. At step 802, the method involves determining an output power range constrained by a spectral mask and an output power range violating the spectral mask constraint. In some embodiments, the ranges are determined with respect to a relationship such as of FIG. 2A. Optionally or alternatively, the ranges are determined according to other characteristics of the output of the power amplifier, such as according to the spectrum of the output response to an input signal.

At step 804, the output of the power amplifier is linearized, or predistorted, in the determined range constrained by the spectral mask to reduce EVM, which is associated with the output of the power amplifier, practically regardless of the spectral mask. The output of the power amplifier is also linearized, or predistorted, in the determined range violating the spectral mask constraint to conform to the spectral mask constraint practically regardless of the EVM. In some embodiments, the association of the EVM with the output of the power amplifier is determined by analyzing the distortion or frequency content of the output of the power amplifier before and/or during and/or after the linearization or predistortion.

Figure 8B:
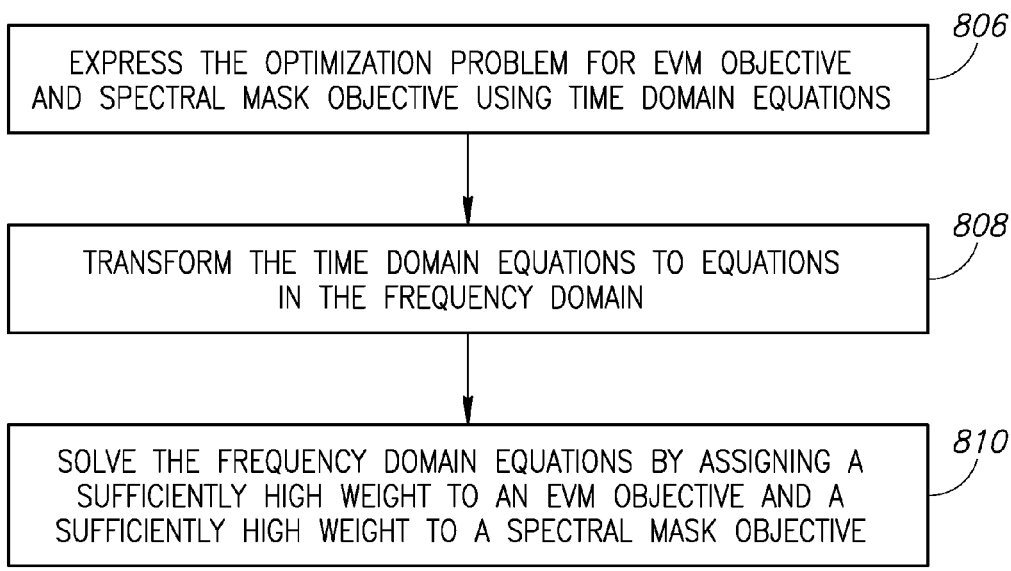
FIG. 8B illustrates an outline for linearization of the output of a power amplifier by applying frequency domain equations and weighting one equation higher than another depending on the objective to be achieved, according to exemplary embodiments of the disclosed subject matter.

FIG. 8B illustrates an outline for linearization of the output of a power amplifier by optimization weighting, according to exemplary embodiments of the disclosed subject matter. At step 806, the predistortion optimization problem for the EVM objective and/or the spectral mask objective is formulated or expressed as time domain equations, such as formulas (1)-(6) above. At step 808, the time domain equations are transformed to a frequency domain, such as formula (7) above. At step 810, the equations are solved by assigning a sufficiently high weight to an EVM objective if that is the desired objective, and/or by assigning a sufficiently high weight for a spectral mask objective if that is the desired objective. In some embodiments, the equations may constitute one equation; and the time domain equations may be based on a Volterra series.

In some embodiments, the linearization of the range conforming to the spectral mask constraint may be carried out separately of the linearization of the range violating the spectral mask constraint. In some embodiments, the linearization reducing the EVM may be performed under a constraint of maximum EVM for low power, such as for a high data rate, and maximum EVM for higher power, such as for a lower data rate.

In some embodiments, another characteristic instead and/or in addition to EVM may be used for linearization. For example, the adherence or fidelity of the transmitted signal, and/or the adherence or fidelity of the received signal, with respect to the input signal of the power amplifier, may be employed.

The subject matter above thus discloses a device and method for linearizing an output of a power amplifier. The device may include an input interface for a source signal and circuitry adapted to distort the source signal by applying one or more frequency domain equations, such as equation (7) involving one or more parameters affecting the output of a power amplifier. A preferred embodiment of the circuitry is illustrated in FIG. 4. The device may also include an output interface for the output signal. The circuitry provides an output signal inversely distorted according to the nonlinearity of the output of the power amplifier. The parameters preferably include the spectral mask and the EVM, as represented in FIG. 2A. One frequency domain equation is preferably directed to abiding by the spectral mask, whereas another equation is preferably directed to improving the EVM. The circuitry is most preferably configured to weight one equation more strongly than another equation depending on the objective.

While certain embodiments have been described, these embodiments have been presented by way of example only, and are not intended to limit the scope of the inventions. Indeed, the novel devices and methods described herein may be embodied in a variety of other forms; furthermore, various omissions, substitutions, and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A device for linearizing an output of a power amplifier, comprising:
   an input interface for receiving a source signal;
   a circuit operative to apply a predistortion transform to the source signal to generate a predistortion output signal therefrom, said predistortion transform representing an inverse of a nonlinear response of the power amplifier expressed in a frequency domain;
   including in said predistortion transform a first one or more equations in the frequency domain adapted to linearize the output of the power amplifier constrained by a spectral mask to reduce an error vector magnitude (EVM) of said power amplifier;
   including in said predistortion transform a second one or more equations in the frequency domain adapted to linearize the output of the power amplifier in a range of frequencies that does not violate a spectral mask requirement; and
   an output interface for the predistortion output signal.

2. The device according to claim 1, wherein one or more first weights are correspondingly applied to said first one or more equations.

3. The device according to claim 1, wherein one frequency domain equation is directed to abiding by the spectral mask and another equation is directed to improving the EVM one or more second weights are correspondingly applied to said second one or more equations.

4. The device according to claim 1, wherein said circuit is further configured to weight said first one or more equations more heavily than said second one or more equations thereby favoring improvement of EVM over spectral mask requirements.

5. The device according to claim 1, wherein said circuit comprises a processor and instructions for predistorting the source signal, at least partially, and wherein the instructions are executable by the processor and stored in a device readable by the processor.

6. A method of predistorting an input signal to a power amplifier, the method comprising:
   receiving an input signal;
   applying predistortion to the input signal in accordance with a transform based on an inverse of a response of the power amplifier, said predistortion represented in a frequency domain;
   including in said transform a first one or more equations in the frequency domain adapted to linearize an output of the power amplifier constrained by a spectral mask to reduce an error vector magnitude (EVM) of said power amplifier; and
   including in said transform a second one or more equations in the frequency domain adapted to linearize the output of the power amplifier in a range of frequencies that does not violate a spectral mask requirement.

7. The method according to claim 6, wherein one or more first weights are correspondingly applied to said first one or more equations.

8. The method according to claim 6, wherein one or more second weights are applied correspondingly to said second one or more equations.

9. The method according to claim 7, wherein some equations are weighted more than others.

10. The method according to claim 8, wherein some equations are weighted more than others.

11. The method according to claim 6, wherein one equation is directed to abiding by the spectral mask and another equation is directed to improving the EVM said first one or more equations are weighted more heavily than said second one or more equations thereby favoring improvement of EVM over spectral mask requirements.

12. The method according to claim 6, wherein the circuitry is further configured to weight one equation more strongly than another equation depending on the objective said second one or more equations are weighted more heavily than said first one or more equations thereby favoring spectral mask requirements over improvement of EVM.

13. A method of calibrating a predistorter for linearizing output signals from a power amplifier, the method comprising:
   determining in the output of a power amplifier a range constrained by a spectral mask and a range where the spectral mask is not violated but EVM performance can be improved;
   applying a frequency domain equation to linearize the output of the power amplifier in the range constrained by the spectral mask to reduce EVM; and applying a frequency domain equation to linearize the output of the power amplifier in the range where the spectral mask is not violated but EVM performance can be improved.

14. The method according to claim 13 further comprising weighting one equation higher than the other equation depending on the objective to be achieved.

15. The device according to claim 1, wherein said circuit is further adapted to weight said second one or more equations more heavily than said first one or more equations thereby favoring spectral mask requirements over improvement of EVM.

16. A method of linearizing an output of a power amplifier, the method comprising:
 receiving an input source signal;
 applying a predistortion transform to the source signal to generate a predistorted output signal therefrom, said predistortion transform representing an inverse of a nonlinear response of the power amplifier;
 wherein the predistortion transform is expressed and applied in a frequency domain and adapted to incorporate at least one parameter effecting the output of the power amplifier;
 wherein said predistortion transform comprises one or more equations weighted so as to favor improvement of error vector magnitude (EVM) and spectral mask requirements; and
 outputting the predistorted output signal.

17. The method according to claim 16, wherein said at least one parameter comprises a parameter effecting an error vector magnitude (EVM) of the output of the power amplifier.

18. The method according to claim 16, wherein said at least one parameter comprises a parameter effecting compliance of the output of the power amplifier to a spectral mask requirement.

19. The method according to claim 16, wherein said one or more equations are weighted so as to favor improvement of error vector magnitude (EVM) over spectral mask requirements.

20. The method according to claim 16, wherein said one or more equations are weighted so as to favor spectral mask requirements over improvement of error vector magnitude (EVM).

* * * * *